United States Patent [19]

Tanaami et al.

[11] Patent Number: 4,590,417
[45] Date of Patent: May 20, 1986

[54] VOLTAGE CONTROLLED DIODE ATTENUATOR

[75] Inventors: Shigeyuki Tanaami; Osamu Yamamoto, both of Tokyo, Japan

[73] Assignee: NEC Corporation, Tokyo, Japan

[21] Appl. No.: 693,101

[22] Filed: Jan. 22, 1985

[30] Foreign Application Priority Data

Feb. 1, 1984 [JP] Japan .................................. 59-17496

[51] Int. Cl.⁴ ............................................. G05F 1/613
[52] U.S. Cl. .................................... 323/229; 323/354; 307/297; 307/561; 307/565; 330/284
[58] Field of Search ........................ 323/229, 353, 354; 307/296 R, 297, 559, 561, 565; 330/284

[56] References Cited

U.S. PATENT DOCUMENTS 3,568,073  3/1971  McGuffin ............................ 307/565
4,354,159  10/1982  Schorr et al. ........................ 323/354

OTHER PUBLICATIONS

Electronic Design 7, Mar. 29, 1977, pp. 100–102, "Need a Pin-Diode Attenuator?" by Roger S. Viles.

Primary Examiner—Peter S. Wong
Assistant Examiner—Anita M. Ault
Attorney, Agent, or Firm—Laff, Whitesel, Conte & Saret

[57] ABSTRACT

A voltage controlled diode attenuator has no coils and, therefore, may be built in integrated circuit form. At least one pair of similarly poled diodes and a resistor are connected in a series circuit. An input signal and variable control voltage are applied to a junction between first and adjoining sides of the pair of diodes. An output voltage appears at an opposite side of one of the diodes. A differential amplifier applies a fixed bias voltage to the output terminal, and a negative feedback is connected between the opposite side of the one diode and an input to the differential amplifier.

10 Claims, 3 Drawing Figures

VOLTAGE CONTROLLED DIODE ATTENUATOR

BACKGROUND OF THE INVENTION

The present invention relates to a diode attenuator for high frequencies and, more particularly, to an improvement in a voltage controlled diode attenuator.

A prior art diode attenuator, of the kind described, is constructed to apply a predetermined dc bias voltage via a choke coil to a series connection of two diodes, and to apply a variable bias control voltage via another choke coil to one of the diodes. The control voltage is varied to control the attenuation of a high frequency signal which flows through the other of the two diodes. Due to the predetermined voltage applied between the two diodes, the input impedance of the attenuator advantageously remains constant despite changes in the attenuation of the diode caused by the variable control voltage, as is well known in the art.

A problem encountered with such a prior art attenuator is that the choke coils included therein make it difficult to set up a wide and usable frequency band attenuator or to provide the attenuator in an integrated circuit. Although the use of resistors in place of the choke coils may be contemplated for biasing purpose, it brings about another problem since a change in the control voltage causes fluctuations in the voltage drops of the resistors. This fluctuation prevents the voltage applied between the two diodes from setting at a predetermined level, resulting in fluctations of the input impedance of the attenuator.

SUMMARY OF THE INVENTION

It is, therefore, an object of the present invention to provide a voltage controlled diode attenuator which, even in an attenuator configuration with biasing resistors, maintains a constant input impedance despite the changes in attenuation.

The present invention provides a voltage controlled diode attenuator having first and second diodes connected in a series such that conducting directions of the two diodes coincide with each other. One end of a first resistor is connected to the first diode. A first means for applying a predetermined dc bias voltage to the first and second diodes is connected into the series circuit via the first resistor. This first means comprises a differential amplifier having first and second input terminals and an output terminal which is connected to the other end of the first resistor. A reference voltage source is connected to the first input terminal, and a negative feedback circuit is connected the second input terminal of a junction between the first diode and the one end of the first resistor. A second means applies a variable control voltage to the second diode via a second resistor. A third means applies a high frequency signal to a junction between the first and second diodes. The high frequency signal is delivered through the first diode to an output terminal at the one end of the first resistor.

DETAILED DESCRIPTION OF THE INVENTION

Figure 1:
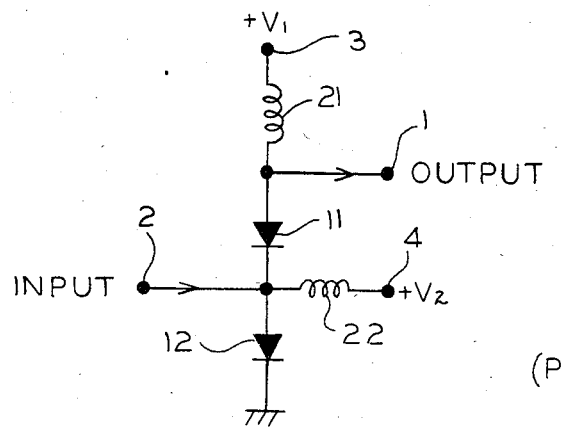
FIG. 1 is a circuit diagram showing an example of prior art voltage controlled diode attenuators.

To facilitate understanding of the present invention, a brief reference will be made to a prior art diode attenuator shown in FIG. 1, which is of the type generally referred to as an inverted-L type attenuator. A predetermined dc bias voltage $+V_1$ is applied to a terminal 3 and is routed to a series connection of diodes (e.g. PIN-diodes) 11 and 12, via a choke coil 21. Meanwhile, a variable bias control voltage $+V_2$ is applied to a terminal 4 and is fed to the diode 12, via a choke coil 22.

A high frequency input signal is applied to an input terminal 2 by way of a coupling capacitor (not shown). The input signal is routed through the diode 11 to an output terminal 1 and is delivered, via another coupling capacitor (not shown). The resistances of the diodes 11 and 12 are determined by the dc bias voltage $+V_1$ and the variable bias control voltage $+V_2$. These resistances attenuate the high frequency signal. A characteristic feature of the illustrated prior art attenuator is due to the application of the predetermined voltage $+V_2$ to the junction of the two diodes 11 and 12. That is, the input impedance of the attenuator remains unchanged when the attenuation by the diodes is changed in response to the variable control voltage. However, the use of choke coils inherent in the prior art attenuator makes it difficult either to offer a wide band of usable frequency or to construct the attenuator in an integrated circuit.

For more information about a diode attenuator of the type using choke coils, reference may be made to Viles "Need a PIN-diode Attenuator?" An improved circuit provides a constant characteristic impedance, logarithmic control and temperature compensation", ELECTRONICS DESIGN 7, pp. 100–102, Mar. 29, 1977.

When the choke coils shown in FIG. 1 are replaced by biasing resistors, a change in the control voltage causes the voltage drops of the resistors to fluctuate so that the voltage between the diodes fails to remain constant.

Figure 2:
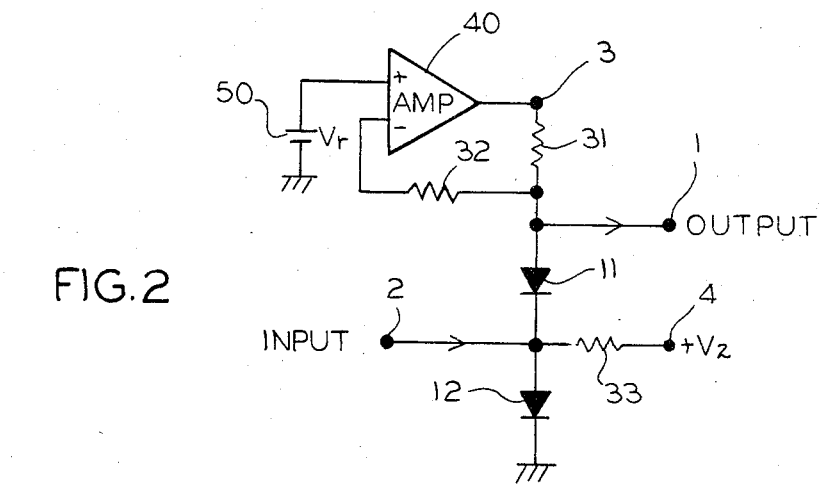
FIG. 2 is a circuit diagram of a voltage controlled attenuator embodying the present invention.

Referring to FIG. 2, an inverted-L type diode attenuator is shown in accordance with the present invention. The diode attenuator in FIG. 2 comprises diodes 11 and 12, resistors 31–33, a differential amplifier 40, and a reference voltage source 50. An output terminal 1 is connected to an anode of the diode 11 and to one end of each of the resistors 31 and 32. The other end of the resistor 31 is connected to an output of the differential amplifier 40 by way of a control terminal 3. The other end of the resistor 32 is connected to a negative input of the amplifier 40. The positive input of the amplifier 40 is connected to a positive terminal of the reference voltage source 50, while a negative terminal of the reference voltage source 50 is connected to a common potential. Meanwhile, an input terminal 2 is connected to a junction of a cathode of the diode 11 and an anode of the diode 12, while the junction between the diodes is, in turn, connected to one end of the resistor 33. The other end of the resistor 33 is connected to a control terminal 4. The cathode of the diode 12 is connected to a common potential (ground potential).

In operation, bias voltages are applied from the outside to the control terminals 3 and 4 and are adjusted to make the diode 11 conductive and the diode 12 cutoff. Thus, the attenuator sets up the minimum attenuation. It will be seen that during such adjustment of the external bias voltages, the input impedance will be held substantially constant if the sum of the bias voltages applied to the diodes 11 and 12 is held constant.

In the illustrative embodiment, a reference voltage is Vr is applied from the reference voltage source 50 to the amplifier 40. The output of the amplifier 40 causes a change in the bias voltage applied to the control terminal 3 with the result that the sum of the voltages applied to the diodes 11 and 12 equals the reference voltage Vr. It follows that even if the bias voltage applied to the control terminal 4 is adjusted to vary the current flowing through the diodes 11 and 12 and, thereby, adjust the attenuation of the attenuator, the sum of the voltage drops developing in the diodes 11 and 12 remains unchanged to maintain the input impedance of the attenuator constant.

Figure 3:
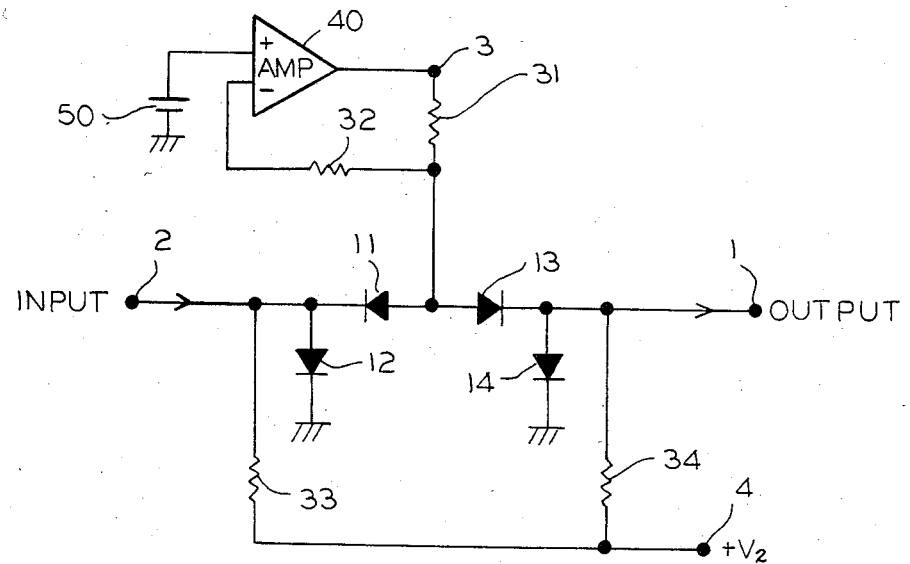
FIG. 3 is a circuit diagram showing another embodiment of the present invention.

Referring to FIG. 3, another embodiment of the present invention is shown which has a $\pi$-type diode attenuator construction. As shown, the attenuator additionally includes a circuit similar to the circuit made up of the two diodes 11 and 12 and resistor 33, i.e., a circuit made up of diodes 13 and 14 and a resistor 34, which is connected to the output terminal 1 side. Such a circuit arrangement accomplishes desirable impedance characteristics both in the input and the output.

In summary, it will be seen that the present invention provides a voltage controlled diode attenuator which promotes the use of a wide frequency band due to the substitution of resistors for choke coils, particularly the coils used in the prior art circuitry. In addition, the resistors allow the attenuator to be produced as a compact, integrated circuit. Furthermore, the attenuator of the present invention finds practically unlimited applications because at least the input impedance thereof is not effected by the adjustment of attenuation.

Those who are skilled in the art will readily perceive how to modify the invention. Therefore, the appended claims are to be construed to cover all equivalent structures which fall within the true scope and spirit of the invention.

What is claimed is:
1. A voltage controlled diode attenuator comprising:
 (a) first and second diodes connected in a series with their conducting direction coinciding with each other;
 (b) a first resistor having one end connected to the first diode;
 (c) first means for applying a predetermined dc bias voltage to the first and second diodes connected in series via the first resistor, said first means comprising a differential amplifier having first and second input terminals and an output terminal, said output terminal of said differential amplifier being connected to the other end of the first resistor, a reference voltage source connected to the first input terminal, and negative feedback means connected between the second input terminal and a junction of the first diode and the one end of the first resistor;
 (d) second means for applying a variable control voltage to the second diode via a second resistor; and
 (e) third means for applying a high frequency signal to a junction between the first and second diodes, being delivered to an output terminal of said diode attenuator said high frequency signal from the one end of the first resistor.

2. A voltage controlled diode attenuator comprising at least a pair of similarly poled diodes connected in a series circuit, means for applying an input signal and a variable control voltage to a junction between said pair diodes, an output voltage appearing at an opposite side of one of said diodes, means including a differential amplifier for applying a fixed bias voltage to said output terminal, and negative feedback means connected between said opposite side of said one diode and an input to said differential amplifier.

3. The voltage controlled attenuator of claim 2 and means for applying said variable control voltage to said junction via a resistor.

4. The voltage controlled attenuator of claim 2 wherein said means for applying said fixed bias comprises a resistor coupled between an output of said differential amplifier and said opposite side of said one diode.

5. The voltage controlled attenuator of claim 4 wherein said differential amplifier has two inputs, and negative feedback means being connected to one of said two inputs and a reference voltage being connected to another of said two inputs.

6. The voltage controlled attenuator of claim 5 and means for applying said variable control voltage to said junction via a resistor.

7. The voltage controlled attenuator of claim 2 wherein there are two pair of said similarly poled diodes, each of said pairs being connected in series and the resulting two series circuits being connected in parallel.

8. The voltage controlled attenuator of claim 7 and means for applying said variable control voltage from a single terminal to the junctions in each of said two pair of diodes via two resistors with said two pair.

9. The voltage controlled attenuator of claim 8 wherein said means for applying said fixed bias comprises a resistor coupled between an output of said differential amplifier and said opposite side of said one diode in each of said two pairs of diodes.

10. The voltage controlled attenuator of claim 9 wherein said differential amplifier has two inputs, said negative feedback means being connected to one of said two inputs and a reference voltage being connected to another of said two inputs.

* * * * *